(12) United States Patent
Huang

(10) Patent No.: US 7,663,895 B2
(45) Date of Patent: Feb. 16, 2010

(54) ELECTROMAGNETIC SHIELDING DEVICE FOR PRINTED CIRCUIT BOARD

(75) Inventor: Meng-Jer Huang, Taipei County (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 97 days.

(21) Appl. No.: 11/959,311

(22) Filed: Dec. 18, 2007

(65) Prior Publication Data

US 2009/0097223 A1 Apr. 16, 2009

(30) Foreign Application Priority Data

Oct. 12, 2007 (CN) .................... 2007 1 0202048

(51) Int. Cl.
*H05K 9/00* (2006.01)

(52) U.S. Cl. .................... 361/818; 361/816; 361/800

(58) Field of Classification Search ................ 361/816, 361/818, 800, 807, 810; 174/35 R, 51, 250
See application file for complete search history.

(56) References Cited

U.S. PATENT DOCUMENTS

| 5,508,889 | A | * | 4/1996 | Ii | ................................ | 361/816 |
| 5,844,784 | A | * | 12/1998 | Moran et al. | ................ | 361/818 |
| 6,608,758 | B1 | * | 8/2003 | Hunt et al. | .................. | 361/753 |

* cited by examiner

*Primary Examiner*—Hung S Bui
(74) *Attorney, Agent, or Firm*—Steven M. Reiss

(57) ABSTRACT

A shielding enclosure (70) includes a cover (72) and a plurality of flanges (74) extending from the cover. At least one flange defines a fixing piece (76). The fixing piece has at least one retaining portion (764), and the retaining portion provides a space (78) allowing a tool is inserted in a generally perpendicular direction relative to the cover of the shielding enclosure.

12 Claims, 9 Drawing Sheets

ELECTROMAGNETIC SHIELDING DEVICE FOR PRINTED CIRCUIT BOARD

BACKGROUND OF THE INVENTION

1. Field of the Invention

The present invention relates to a shielding device for a printed circuit board, and particularly to a shielding device having a shielding enclosure that may be easily removed.

2. Discussion of the Related Art

Electronic components of a printed circuit board radiate electromagnetic waves which generate noise or unwanted signals. Accordingly, it is highly desirable to provide shielding for electronic components of printed circuit boards, which is susceptible to electromagnetic radiation. Since the electric telecommunication equipment must withstand interference of electromagnetic radiation, shielding device must be used therein in order to decrease radiation emission.

The shielding device usually contain an enclosure and a frame. The cover of the shielding device can be opened to access of the electronic components inside the enclosure. Referring to FIGS. 8 and 9, a conventional shielding device includes a frame 10 and a shielding enclosure 30. The frame 10 is mounted on a printed circuit board 20, and is used for surrounding electronic components on the printed circuit board 20. The frame 10 is made up of a plurality of walls. Each wall positions a plurality of projections 12. The shielding enclosure 30 includes a cover 32 and a plurality of flanges 34. The shape of the cover 32 is similar to that of the frame 10. Each flange 34 forms a fixing piece 36, which includes a body portion 362 and a tab 364. The body portion 362 is perpendicularly connected to the cover 32, and is spaced from a bottom surface of the flanges 34. The body portion 362 defines a through hole 3622 for receiving a corresponding projection 12. The tab 364 is perpendicularly extended from the body portion 362. The tab 364 is spaced from the bottom surface of the flanges 34, thereby defining a clearance.

In assembly, each projection 12 is received in a corresponding through hole 3622 for securely attaching the shield enclosure 30 to the frame 10. During removal of the shield enclosure 30, a suitable tool is inserted into the clearance under the tab 364. Then, the tool is used to raise the fixing piece 36 away from the frame 10. Accordingly, the projection 12 is separated from the through hole 3262, thereby the shield enclosure 30 being removed from the frame 10. Since the opening direction of the clearance is parallel with the cover, the tool needs to be substantially horizontally inserted into the clearance under the tab 364. Accordingly, the printed circuit board needs to preserve an extra space for the tool to be received therein. When a plurality of shielding devices are positioned adjacent to each other or the electronic component on the printed circuit board 20 is close to the fixing piece 36 of the shielding enclosure 30, the tool is difficult to be inserted into the clearance. Therefore, this makes it difficult to remove the shielding enclosure 30.

Therefore, an improved shielding device is desired in order to overcome the above-described shortcoming.

SUMMARY OF THE INVENTION

One embodiment of the present shielding enclosure includes a cover and a plurality of flanges extending from the cover. At least one flange defines a fixing piece. The fixing piece has at least one retaining portion, and the retaining portion provides a space allowing a tool to be inserted in a generally perpendicular direction relative to the cover of the shielding enclosure.

Other advantages and novel features of the present shielding device will become more apparent from the following detailed description thereof when taken in conjunction with the accompanying drawings.

BRIEF DESCRIPTION OF THE DRAWINGS

Many aspects of the shielding device can be better understood with reference to the following drawings. The components in the drawings are not necessarily drawn to scale, the emphasis instead being placed upon clearly illustrating the principles of the present shielding device. Moreover, in the drawings, like reference numerals designate corresponding parts throughout the several views, in which.

DETAILED DESCRIPTION OF THE INVENTION

Figure 1:
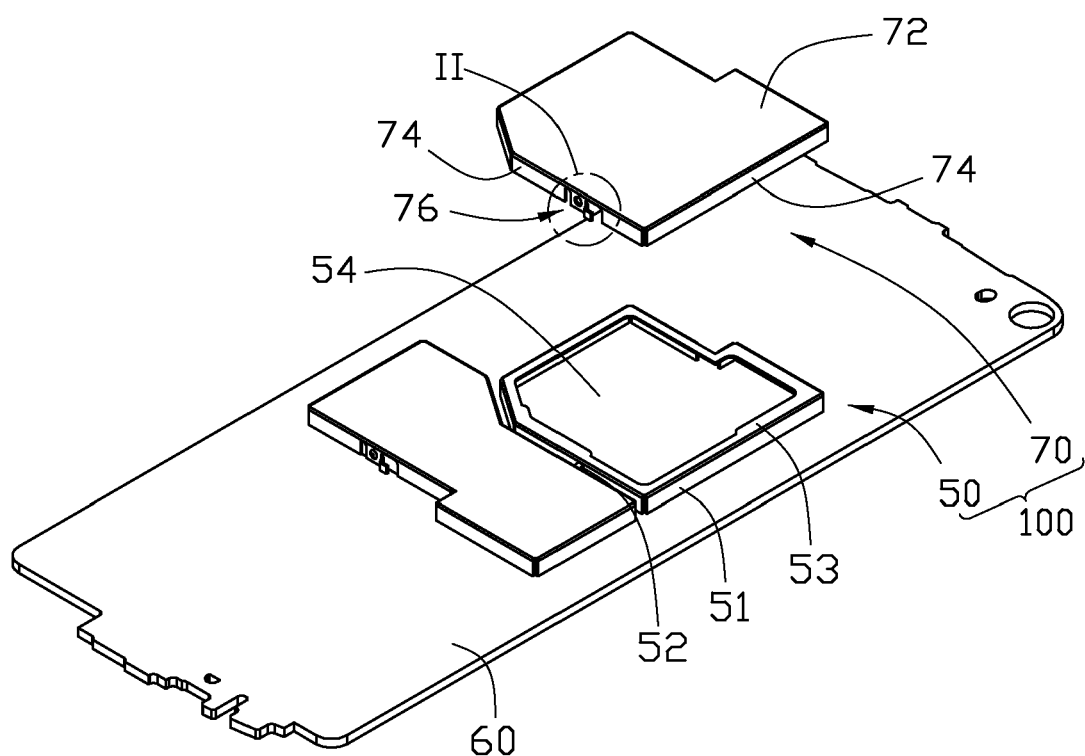
FIG. 1 is a schematic view of a first embodiment of the present shielding device.
Figure 2:
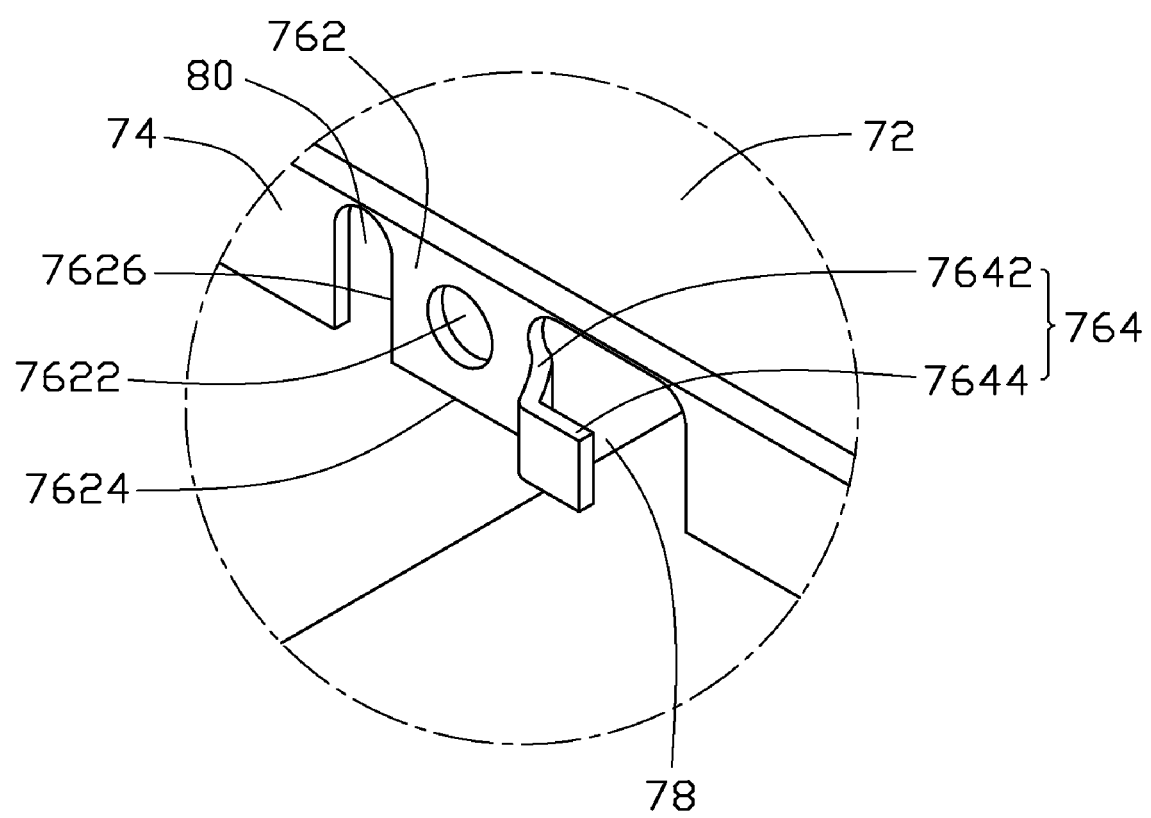
FIG. 2 is an enlarged view of FIG. 1 in II area thereof.

Referring to FIGS. 1 and 2, the shielding device 100, in one illustrated first embodiment, is positioned on a printed circuit board 60. Understandably, the shielding device 100 is used for shielding at least one electronic component. The shielding device 100 includes a frame 50 and a shielding enclosure 70. The shielding enclosure 70 can be easily removed to access the electrical components contained therein.

The frame 50 includes a top wall 53 and a plurality of side walls 51 depending downwardly from outer edges of the top wall 53. The frame 50 shown herein for illustrative purpose is polygon, however, any other shapes such as square or rectangular may also be used. The frame 50 defines a central opening 54 for receiving electrical components disposed on the printed circuit board 60. The side walls 51 are configured for being soldered to a conductive area of the printed circuit board 60 so that the side walls 51 of the frame 50 surround the electronic components on the printed circuit board 60. Each side wall of the frame 51 disposes at least one circular projections 52.

The shielding enclosure 70 is polygonal in shape corresponding to the frame 50 described above. As previously discussed with respect to the frame 50, the shielding enclosure 70 may be configured in a shape other than polygon. The shielding enclosure 70 includes a cover 72 and a plurality of flanges 74. An upper surface of the cover 72 is generally parallel to the top wall 53 of the frame 50 when the shielding enclosure 70 is positioned over the frame 50. The flanges 74 extend downwardly from the cover 72 at an angle of approximately 90 degrees allowing the flange 74 to cover over the frame 50. At least one flange 74 forms a fixing piece 76. Each fixing piece 76 is spaced apart from two sides of the flange 74 so as to respectively define a gap 80 therebetween.

Each fixing piece 76 includes a body portion 762 and a retaining portion 764. The body portion 762 is rectangular, and is substantially coplanar adjacent to the flanges 74. The body portion 762 defines a through hole 7622 in a central area thereof. A diameter of the through hole 7622 is substantially the same as that of the projection 52. Accordingly, the body portion 762 may be placed around the projection 52 for securely attaching the shielding enclosure 70 to the frame 50. The body portion 762 includes a bottom edge 7624 and two side edges 7626. The retaining portion 764 is connected to one of side edges 7626. The retaining portion 764 includes a connecting section 7642 and a resisting section 7644. The connecting section 7642 extends outwardly from one of the side edges 7626 of the body portion 762 at an angle of smaller than 90 degrees. The resisting section 7644 extends from one freed end of the connecting section 7642, and is parallel with the body portion 762. The connecting section 7642 allows the resisting section 7644 to be spaced apart from the flange 74, thereby defining a space 78. The open direction of the space 78 is generally perpendicular to the cover 72. When the shielding enclosure 70 is detached relative to the frame 50, a suitable tool may be inserted into the space 78 in a generally perpendicular direction relative to the cover 72.

The frame 50 and the shielding enclosure 70 are preferably made from a metallic material, such as tin plated steel. However, other metal materials such as tin plated phosphor bronze, beryllium copper and other alloys of copper may also be used depending upon the require shielding. In particular, however, it is desirable that the metal materials used for manufacturing the shielding enclosure 70 are capable of being readily soldered or welded with low resistance electrical conductivity. However, if the primary purpose of the shield is to reduce magnetic field interference, it is generally preferable to use a steel or other alloy that has a relatively high permeability at low frequencies. To provide electrical conductivity on materials with relatively high resistance, the material may be plated with a low resistance metal, such as tin. If the principal concern of the shield is to reduce electrical field interference, then it is generally preferable to use a copper alloy as will be readily apparent to one skilled in the art of electromagnetic shielding.

In an alternative embodiment, the shielding system 100 of the present invention may be easily and inexpensively manufactured. At first, the shielding enclosure 70 including the cover 72 is stamped or punched from a sheet metal. At the same time, the sheet metal is also directly cut into the fixing piece 76 and the gaps 80. Afterwards, the sides of the shielding enclosure 70 are bent to form the flanges 74 and thereby obtain the final product of shielding enclosure 70. The frame 50 is likewise easily formed using standard sheet metal or sheet foil processing techniques.

In assembly, the frame 50 is disposed over one or more electric or electronic components on the printed circuit board 60 in order to reduce the electromagnetic interference with adjacent components, and is mounted on the printed circuit board 60 by soldering or the like. The shielding enclosure 70 is positioned over the frame 50. The flanges 74 of the shielding enclosure 70 are placed around the side walls 51 of the frame 50. The projections 52 of the frame 50 are received in the through holes 7622 of the fixing piece 76. Accordingly, the shielding enclosure 70 is fixed in the frame 50. When the components shielded in the shielding device 100 need to be replaced, repaired or otherwise adjusted, the shielding enclosure 70 can easily be removed using a tool.

Figure 3:
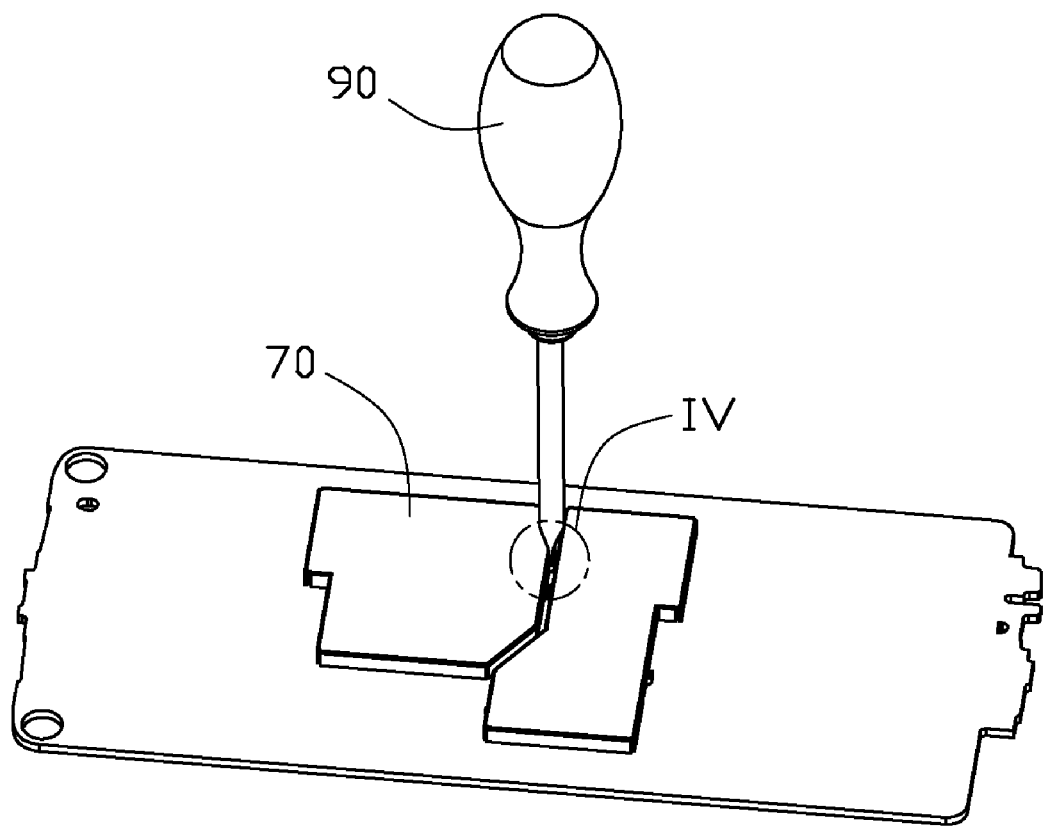
FIG. 3 is a schematic view when the shielding enclosure is being detached.
Figure 4:
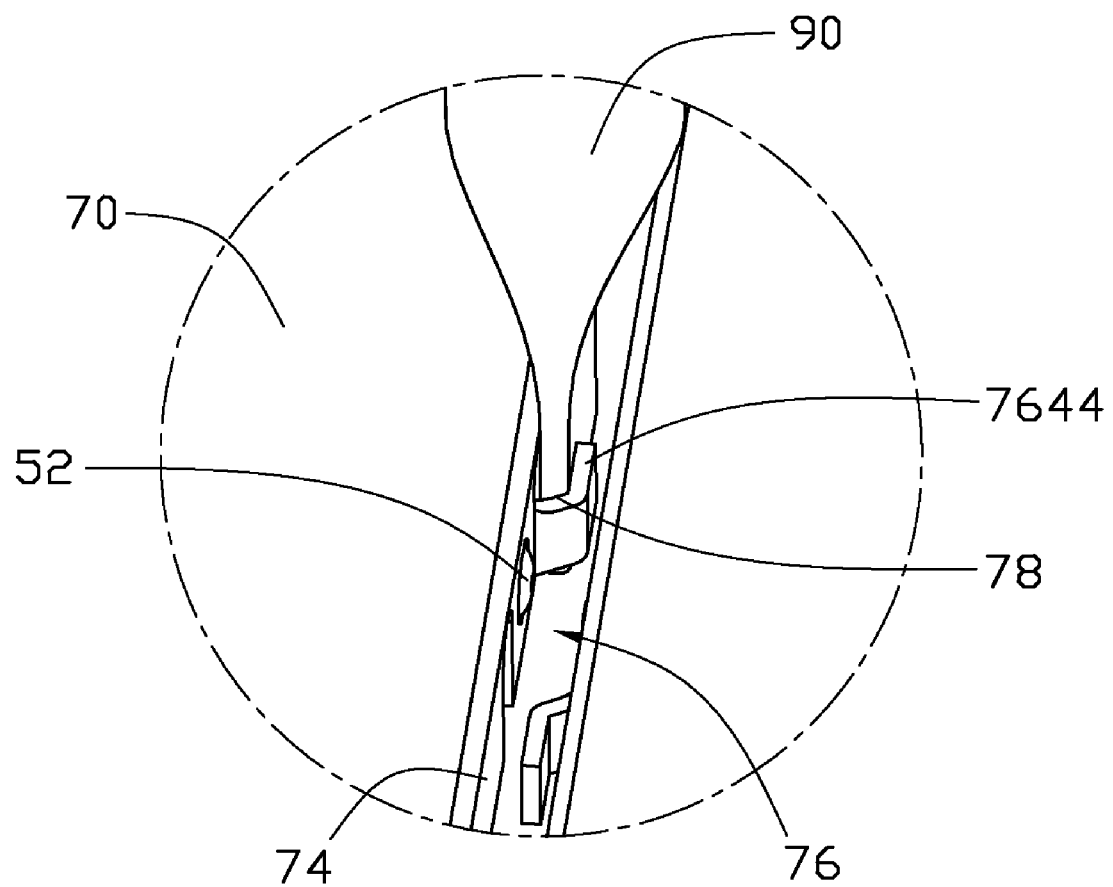
FIG. 4 is an enlarged view of FIG. 3 in IV area thereof.

Referring to FIGS. 3 and 4, when removing the shielding enclosure 70, a tool 90 is inserted into the space 78 with a perpendicular direction relative to the cover 72. Then, the tool 90 applies force to the resisting section 7644 so as to make the fixing piece 76 break away from the projection 52. Accordingly, the shielding enclosure 70 is separated from the frame 50. Since the opening direction of the space 78 is perpendicular to the cover 72, when a plurality of shielding devices are positioned adjacent to each other or the electronic component on the printed circuit board 60 is close to the fixing piece 76 of the shielding enclosure 70, the tool 90 may be perpendicularly inserted into the space 78. The tool 90 does not need to occupy an additional storage space, and does not damage the adjacent electronic components. Therefore, the shielding enclosure 70 can be conveniently removed. In addition, the shielding device 100 of the present invention allows access to the electronic component received therein, such that the electronic components on the printed circuit board may be replaced, rather than replacing the entire printed circuit board.

Figure 5:
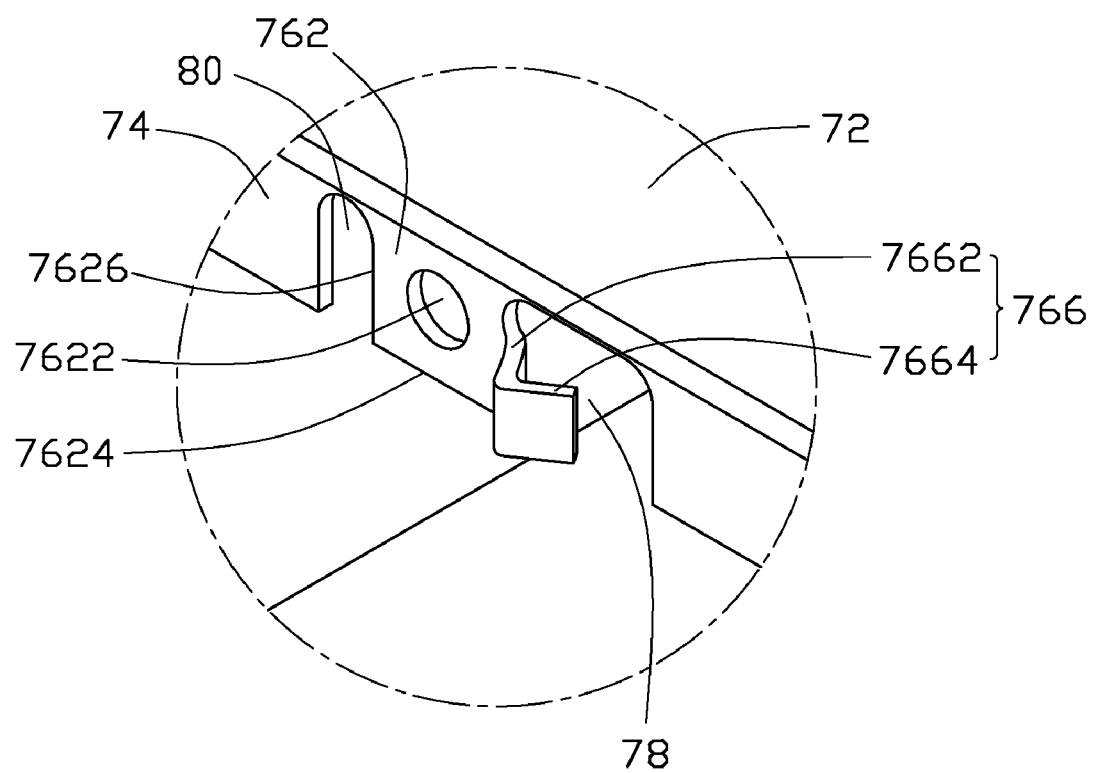
FIG. 5 is an enlarged schematic view of a second embodiment of the shielding enclosure.
Figure 6:
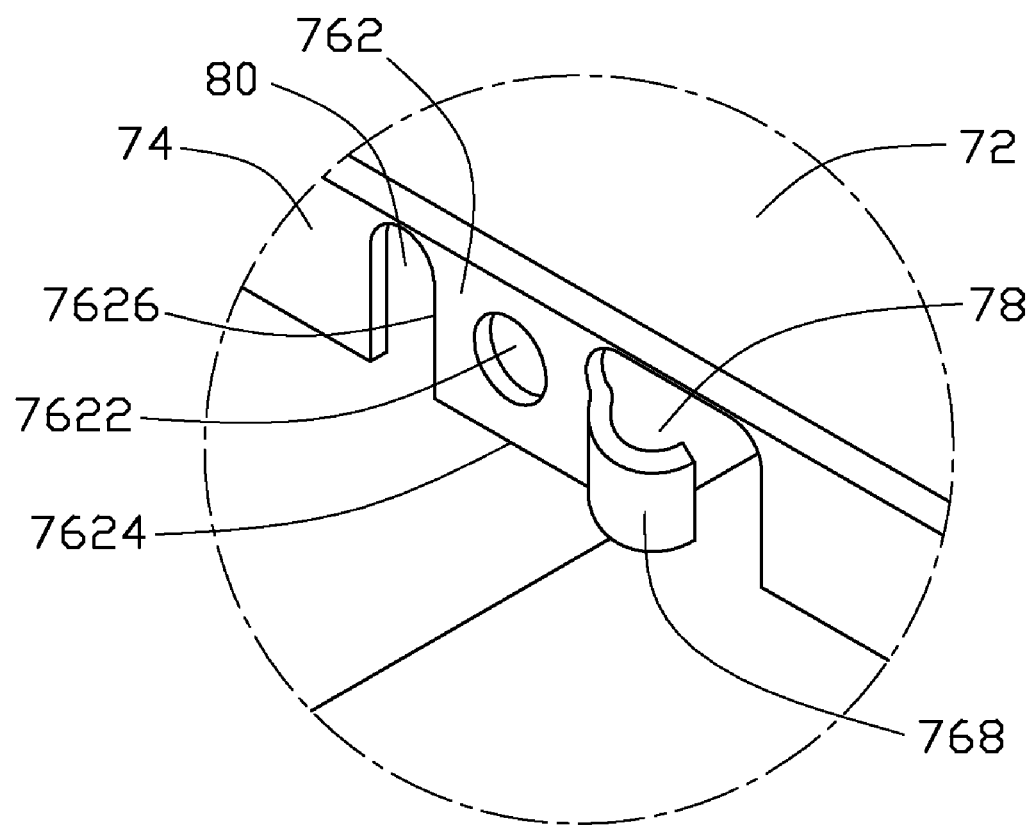
FIG. 6 is an enlarged schematic view of a third embodiment of the shielding enclosure.
Figure 7:
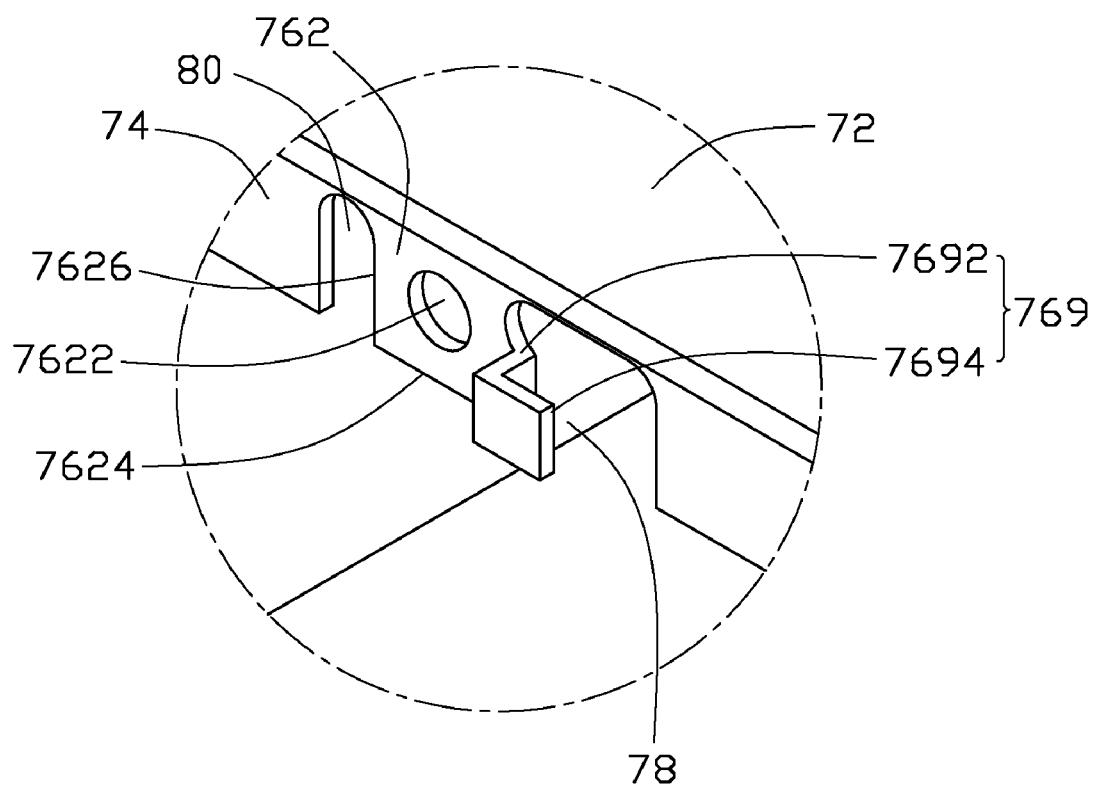
FIG. 7 is an enlarged schematic view of a fourth embodiment of the shielding enclosure.
Figure 8:
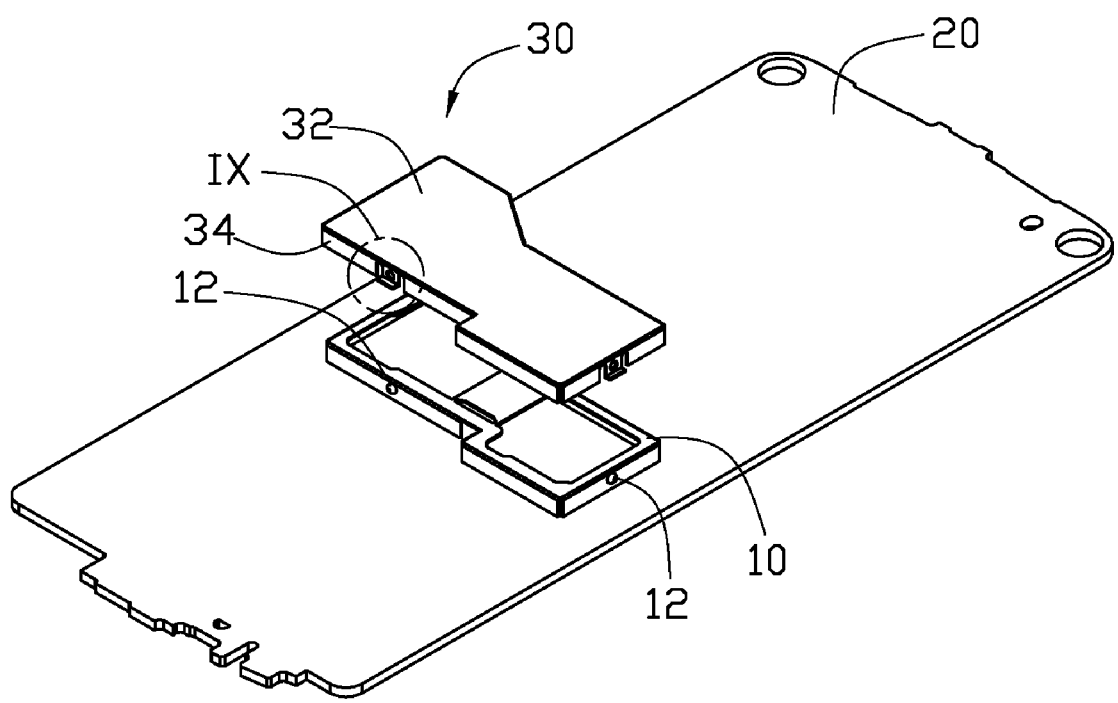
FIG. 8 is a schematic view of a conventional shielding device.
Figure 9:
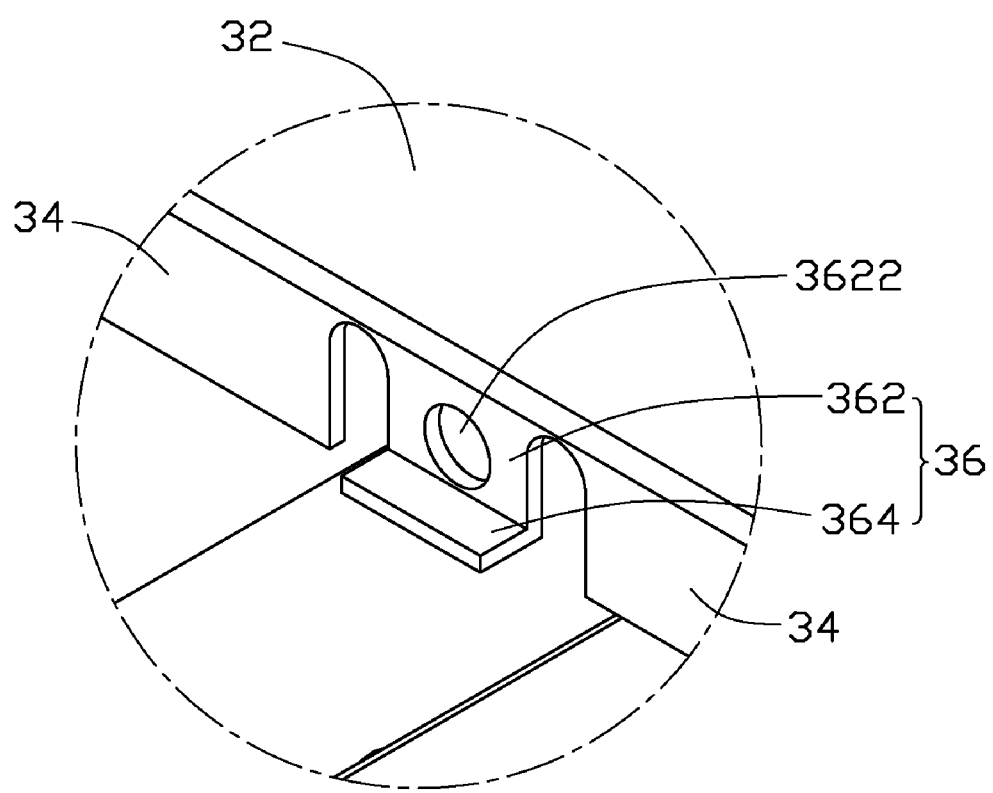
FIG. 9 is an enlarged view of FIG. 8 in IX area thereof.

The retaining portion may have many structures. In a second embodiment, referring to FIG. 5, the fixing piece 766 includes a connecting portion 7662 and an extending portion 7664. The extending portion 7664 is warped toward the flange so that the connecting portion 7662 is in an acute angle with the extending portion 7644. In a third embodiment, referring to FIG. 6, the fixing piece 76 has an arcuate portion 768, which is warped towards inside of the flange 74. The arcuate portion 768 is spaced apart from the flange 74, thereby forming a space 78. In a fourth embodiment, referring to FIG. 7, the fixing piece 769 includes a connecting portion 7692 and an extending portion 7694. The connecting portion 7692 is perpendicularly connected to the flange 74. It is to be understood that the fixing piece may have shapes other than shown herein.

It is to be understood that the projections 52 may have shapes other than shown herein and the shielding enclosure 70 may define a though hole corresponding to the shape of the projections 52. It is also to be understood that the projection may be formed on the shielding enclosure 70 and the through hole is located on the frame 50.

As described above, the present invention provides a shielding device 100 for shielding electronic component. The shielding enclosure can be easily removed by means of a suitable tool. The fixing piece may provide a space for the tool at an upper side thereof. Even if many shielding devices are positioned adjacent to each other or the electronic component on the printed circuit board is close to the fixing piece of the shielding enclosure, the tool can easily be perpendicularly inserted into the space between the resisting section and the flange. Therefore, this makes it convenient to remove the shielding enclosure.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A shielding enclosure comprising:
   a cover; and
   a plurality of flanges extending from the cover, at least one flange defining a fixing piece, the fixing piece having at least one partially bent and flexible retaining portion, wherein the partially bent and flexible retaining portion defines a space corresponding in shape and size to a tool to be inserted into the space for deflecting the retaining portion and allowing removal of the shielding enclosure; and wherein the retaining portion includes a connecting portion and a resisting portion, and the connection portion is tilted with the resisting portion, and the resisting portion is parallel to the cover.

2. The shielding enclosure as claimed in claim 1, wherein the resisting portion is with the connecting portion at an acute angle.

3. The shielding enclosure as claimed in claim 2, wherein the retaining portion is arcuate, and is warped towards inside of the flanges.

4. The shielding enclosure as claimed in claim 1, wherein the fixing piece further defines a body portion, the body portion is connected to the retaining portion, and the body portion defines a through hole.

5. The shielding enclosure as claimed in claim 1, wherein two sides of the fixing piece define a gap in the flange.

6. A shielding device comprising:
   a frame comprising a plurality of sidewalls, each side wall of the frame forming at least one projection; and
   a shielding enclosure removably attached to the frame, the shielding enclosure comprising a cover and a plurality of flanges extending therefrom for engagement with the sidewalls of the frame, each flange forming at least one fixing piece;
   wherein at least one flange provides a retaining portion and a body portion, and the retaining portion provides a space allowing a tool to be inserted in a generally perpendicular direction relative to the cover of the shielding enclosure, the body portion defines a through hole for receiving the at least one projection.

7. The shielding device as claimed in claim 6, wherein the frame and the shielding enclosure are formed from stamped metal.

8. The shielding device as claimed in claim 6, wherein the frame further comprises a top wall, and the side walls extend downwardly from the top wall.

9. The shielding device as claimed in claim 6, wherein the retaining portion includes a connecting portion and a resisting portion, the connection portion is tilted with the resisting portion, and the resisting portion is parallel to the cover.

10. The shielding device as claimed in claim 6, wherein the retaining portion includes a connecting portion and a resisting portion, the connection portion is with the connecting portion in an acute angle.

11. The shielding device as claimed in claim 6, wherein the retaining portion is arcuate, and is warped towards inside of the flanges.

12. A method for shielding and obtaining access to a component on a printed circuit board, said method comprising:
   providing a printed circuit board having a component encompassed by a frame and a shielding enclosure attached thereto, the shielding enclosure including a cover and a plurality of flanges extending from the cover, at least one flange forming a retaining portion which provides a space;
   inserting a tool into the space of the retaining portion with a perpendicular direction relative to the cover;
   applying a force to the retaining portion of the shielding enclosure by the tool;
   removing the shielding enclosure, thereby leaving the frame and allowing access to the component within the shielding enclosure.

* * * * *